(12) United States Patent
Niu et al.

(10) Patent No.: US 10,763,221 B2
(45) Date of Patent: *Sep. 1, 2020

(54) HV CONVERTER WITH REDUCED EMI

(71) Applicant: Alpha and Omega Semiconductor (Cayman), Ltd., Grand Cayman (KY)

(72) Inventors: Zhiqiang Niu, Santa Clara, CA (US); Kuang Ming Chang, Fremont, CA (US); Lin Chen, San Jose, CA (US); Ning Sun, San Jose, CA (US); QiHong Huang, San Jose, CA (US); Tzu-Hsin Lu, San Jose, CA (US)

(73) Assignee: ALPHA AND OMEGA SEMICONDUCTOR (CAYMAN), LTD., Grand Cayman (KY)

(*) Notice: Subject to any disclaimer, the term of this patent is extended or adjusted under 35 U.S.C. 154(b) by 0 days.

This patent is subject to a terminal disclaimer.

(21) Appl. No.: 16/555,567

(22) Filed: Aug. 29, 2019

(65) Prior Publication Data

US 2019/0385953 A1    Dec. 19, 2019

Related U.S. Application Data

(63) Continuation of application No. 15/940,949, filed on Mar. 29, 2018, now Pat. No. 10,438,900.

(51) Int. Cl.
*H01L 23/552*    (2006.01)
*H01L 23/495*    (2006.01)
(Continued)

(52) U.S. Cl.
CPC ........ *H01L 23/552* (2013.01); *H01L 23/3114* (2013.01); *H01L 23/4952* (2013.01);
(Continued)

(58) Field of Classification Search
CPC .............. H01L 23/552; H01L 23/3114; H01L 23/49503; H01L 23/4952; H01L 23/49558; H01L 23/49562; H01L 23/49568; H01L 23/49575; H02M 1/44; H02M 3/33569; H02M 3/33576; H05K 1/09; H05K 1/111; H05K 1/18; H05K 2201/10022; H05K 2201/1003; H05K 2201/10378
(Continued)

(56) References Cited

U.S. PATENT DOCUMENTS

| 5,402,329 A | 3/1995 | Wittenbreder, Jr. |
| 2015/0206868 A1* | 7/2015 | Zhang ............... H01L 23/49503 438/108 |
| 2017/0264206 A1 | 9/2017 | Rana et al. |

* cited by examiner

*Primary Examiner* — Tong-Ho Kim
(74) *Attorney, Agent, or Firm* — Chen-Chi Lin

(57) ABSTRACT

A high voltage (HV) converter implemented on a printed circuit board (PCB) includes a double diffused metal oxide semiconductor (DMOS) package comprising a lead frame and a main DMOS chip. The lead frame includes a gate section electrically connected to a gate electrode of the main DMOS chip, a source section electrically connected to a source electrode of the main DMOS chip and a drain section electrically connected to a drain electrode of the main DMOS chip. The PCB layout includes a large area source copper pad attached to and overlapping the source section of the DMOS package to facilitate cooling and a small area drain copper pad attached to and overlapping the drain section of the DMOS package to reduce electromagnetic interference (EMI) noise.

23 Claims, 11 Drawing Sheets

(51) Int. Cl.
   *H01L 23/31*     (2006.01)
   *H05K 1/11*      (2006.01)
   *H05K 1/09*      (2006.01)
   *H05K 1/18*      (2006.01)
   *H02M 1/44*      (2007.01)
   *H02M 3/335*     (2006.01)

(52) U.S. Cl.
   CPC .. *H01L 23/49503* (2013.01); *H01L 23/49558* (2013.01); *H01L 23/49562* (2013.01); *H01L 23/49568* (2013.01); *H01L 23/49575* (2013.01); *H02M 1/44* (2013.01); *H05K 1/09* (2013.01); *H05K 1/111* (2013.01); *H05K 1/18* (2013.01); *H02M 3/33569* (2013.01); *H02M 3/33576* (2013.01); *H05K 2201/1003* (2013.01); *H05K 2201/10022* (2013.01); *H05K 2201/10378* (2013.01)

(58) Field of Classification Search
   USPC ........................................................ 257/666
   See application file for complete search history.

HV CONVERTER WITH REDUCED EMI

CROSS-REFERENCE TO RELATED APPLICATIONS

This patent application is a Continuation of a pending patent application Ser. No. 15/940,949 filed on Mar. 29, 2018. The disclosure made in the pending patent application Ser. No. 15/940,949, the disclosure made in the U.S. Pat. No. 5,402,329 to Wittenbreder Jr. and the disclosure made in U.S. Patent Application Publication Number 2017/0264206 to Rana et al. are hereby incorporated by reference.

FIELD OF THE INVENTION

This invention relates generally to high voltage converters using double-diffused metal-oxide semiconductor (DMOS) devices. More particularly, the present invention relates to a high voltage converter with improved electromagnetic interference (EMI) noise using an improved DMOS package.

BACKGROUND OF THE INVENTION

FIG. 1 shows circuitry 400 of a single-switch flyback converter in examples of the present disclosure. The single-switch flyback converter includes a switch 420, a transformer 440 and a resistor 460. The transformer 440 has a primary winding 442 and a secondary winding 444. A first end of the switch 420 is connected to a first end of the primary winding 442 of the transformer 440. A second end of the switch 420 is connected to the first end of the resistor 460. A second end of the resistor 460 is connected to a ground.

FIG. 2 shows a printed circuit board (PCB) layout 500 for a conventional single-switch flyback converter. The PCB layout 500 is configured to receive a conventional DMOS device. The conventional DMOS device has a small area source lead attached to a small copper pad 510 on the PCB and a large area drain lead 540 attached to a large copper pad area 520 on the PCB. The DMOS chip is above the large copper pad area 520 overlapping the large area drain lead 540. The drain electrode of the DMOS chip is connected to the transformer TX1 through the large area drain lead 540 and large copper pad area 520. The source electrode of the DMOS chip is connected to ground through resistor R2. The performance of the PCB layout 500 is not optimized due to necessary tradeoff between thermal dissipation and EMI noise reduction. The DMOS device Q1 is hot and needs a large copper pad area 520 (for example, larger than 10 mm in length and 5 mm in width) for cooling. However, the large area drain lead 540 has high voltage and has high dv/dt value. It couples electromagnetic interference (EMI) noise to the system. This may not be a problem for low voltage application. However for high voltage applications such as 500V or higher, the EMI noise is high due to the fast changing and high drain voltage. It requires a small copper pad area 520 to reduce the EMI noise. This is in contrary to larger copper pad area 520 for cooling purpose. The tradeoff of a large copper pad area 520 is large EMI noise. Furthermore, for high voltage applications, the high voltage drain lead with large area will demand large safety space therefore increasing the device area, making it challenge to minimize the device size while keeping safety space for high voltage.

It is advantageous to implement an improved DMOS package in high voltage flyback application to reduce the EMI. It is advantageous to improve the DMOS package by reducing the drain lead area to reduce the EMI of the flyback convertor, and further to add an insulation material between the DMOS chip and a lead frame, to introduce V-shaped grooves in the lead frame, and to use an island-type lead frame (with raised portions) because it results in better thermal performance by having a large copper pad area yet still with less electromagnetic noise.

SUMMARY OF THE INVENTION

The present invention discloses high voltage converters implementing with double-diffused metal-oxide semiconductor (DMOS) packages including a lead frame, a main DMOS chip, a first plurality of metal bumps, a second plurality of metal bumps, a connector and a molding encapsulation. The lead frame includes a gate section, a source section and a drain section. The main DMOS chip has a gate electrode and a source electrode disposed on a bottom surface of the main DMOS chip and a drain electrode disposed on a top surface of the main DMOS chip. A PCB layout for a flyback converter includes a large copper pad area on the PCB overlapping with a large source lead area to facilitate cooling and a small copper pad area on the PCB overlapping with a small drain lead area to minimize electromagnetic interference (EMI) noise.

A DMOS package may include a main switch and a clamping switch. In one example, the main switch includes a main DMOS chip. The clamping switch includes a clamping DMOS chip. For applications, the DMOS package may be included in a pair-switch flyback converter, a pair-switch active clamp forward converter, or a pair-switch active clamp forward/flyback converter.

DETAILED DESCRIPTION OF THE INVENTION

Figure 1:
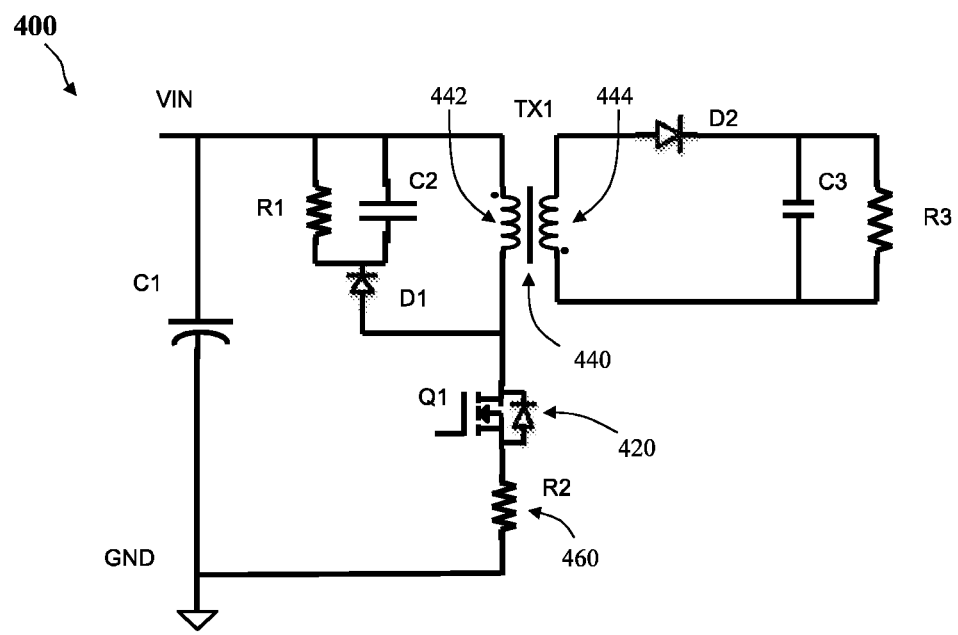
FIG. 1 shows circuitry of a single-switch flyback converter.
Figure 2:
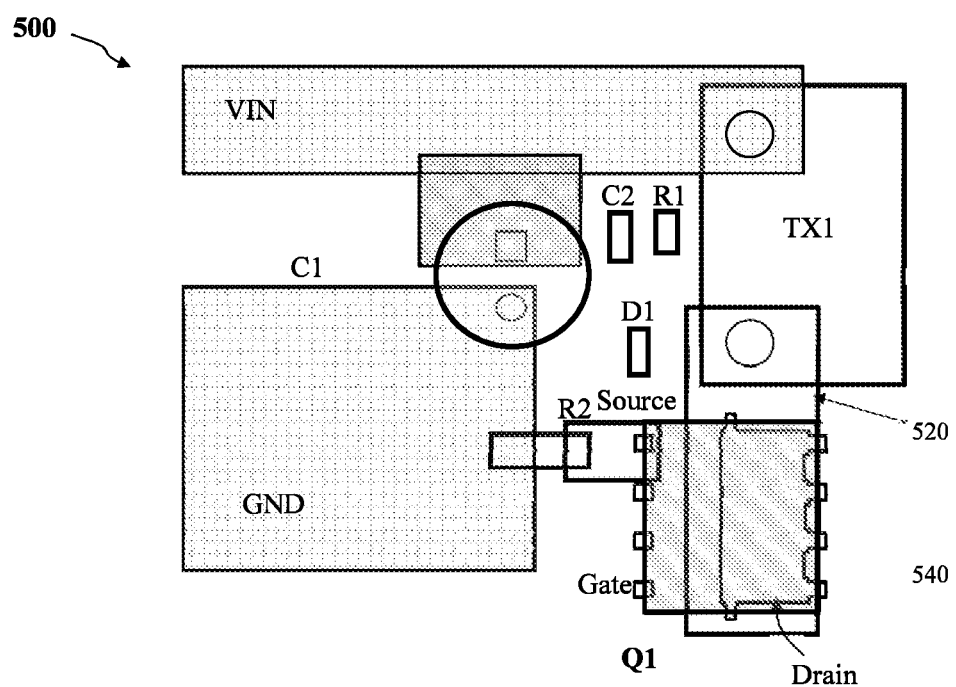
FIG. 2 shows a conventional printed circuit board (PCB) layout for a single-switch flyback converter.
Figure 3:
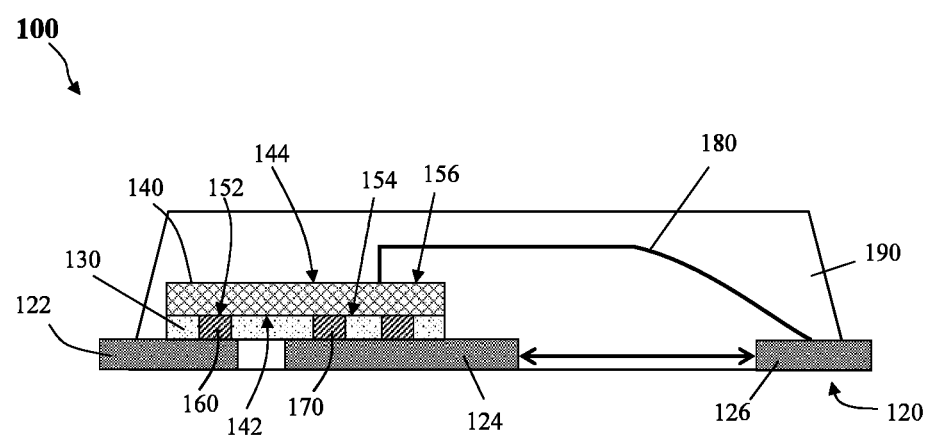
FIG. 3 is a cross sectional view of a double-diffused metal-oxide semiconductor (DMOS) package in examples of the present disclosure.

FIG. 3 is a cross sectional view of a double-diffused metal-oxide semiconductor (DMOS) package 100 in examples of the present disclosure. The DMOS package 100 includes a lead frame 120, an insulation material 130, a main DMOS chip 140, a first plurality of metal bumps 160, a second plurality of metal bumps 170, a wire 180 and a molding encapsulation 190. The lead frame 120 includes a gate section 122, a source section 124 and a drain section 126. To achieve thermal performance and to reduce EMI noise, in one example, the source section 124 accounts for more than 50% of the bottom surface area of the DMOS package 100. In another example, the source section 124 accounts for more than 70% of the bottom surface area of the DMOS package 100. In still another example, the source section 124 is 10 times in size of the drain section 126. The main DMOS chip 140 has a gate electrode 152 and a source electrode 154 disposed on a first surface 142 of the main DMOS chip 140 and a drain electrode 156 disposed on a second surface 144 of the main DMOS chip 140. The second surface 144 is opposite the first surface 142. The second surface 144 is parallel to the first surface 142. The second surface 144 is at a location higher than the first surface 142.

The first plurality of metal bumps 160 are directly attached to the gate electrode 152 of the main DMOS chip 140 and directly attached to the gate section 122 of the lead frame 120. The second plurality of metal bumps 170 are directly attached to the source electrode 154 of the main DMOS chip 140 and directly attached to the source section 124 of the lead frame 120. The wire 180 connects the drain electrode 156 of the main DMOS chip 140 to the drain section 126 of the lead frame 120.

In examples of the present disclosure, the insulation material 130 is between a top surface of the lead frame 120 and the first surface 142 of the main DMOS chip 140. In examples of the present disclosure, the insulation material 130 is directly attached to the first surface 142 of the main DMOS chip 140, the first plurality of metal bumps 160, the second plurality of metal bumps 170, the gate section 122 of the lead frame 120 and the source section 124 of the lead frame 120. In one example, the insulation material 130 is an electromagnetic shielding material. In another example, the insulation material 130 is polyimide. In still another example, the insulation material 130 is silicon gel.

The insulation material 130, the main DMOS chip 140, the first plurality of metal bumps 160, the second plurality of metal bumps 170, the wire 180 and a majority portion of the lead frame 120 are embedded in the molding encapsulation 190.

In examples of the present disclosure, the molding encapsulation 190 is made of epoxy. In examples of the present disclosure, the lead frame is made of metal. In examples of the present disclosure, the lead frame is made of aluminum. To achieve thermal performance and to reduce EMI noise, in one example, the bottom surface area of the source section 124 exposed outside the encapsulation 190 accounts for more than 50% of the bottom surface area of the DMOS package 100. In another example, the bottom surface area of the source section 124 exposed outside the encapsulation 190 accounts for more than 70% of the bottom surface area of the DMOS package 100. In still another example, the bottom surface area of the source section 124 exposed outside the encapsulation 190 is more than 10 times the bottom surface area of the drain section 126 exposed outside the encapsulation 190.

Figure 4A:
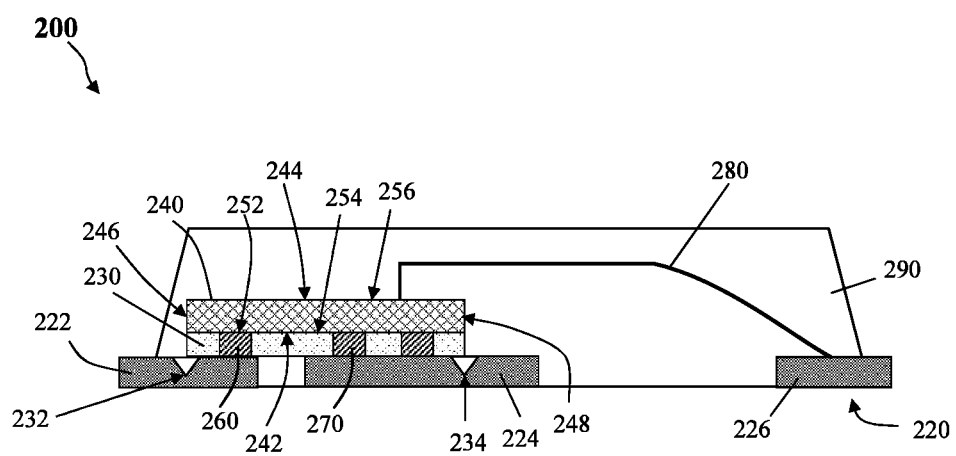
FIG. 4A is a cross sectional view of another DMOS package in examples of the present disclosure.

FIG. 4A is a cross sectional view of a DMOS package 200 in examples of the present disclosure. The DMOS package 200 includes a lead frame 220, an insulation material 230, a main DMOS chip 240, a first plurality of metal bumps 260, a second plurality of metal bumps 270, a wire 280 and a molding encapsulation 290. The lead frame 220 includes a gate section 222, a source section 224 and a drain section 226. The main DMOS chip 240 has a gate electrode 252 and a source electrode 254 disposed on a first surface 242 of the main DMOS chip 240 and a drain electrode 256 disposed on a second surface 244 of the main DMOS chip 240. The second surface 244 is opposite the first surface 242. The second surface 244 is parallel to the first surface 242. The second surface 244 is at a location higher than the first surface 242.

In examples of the present disclosure, a first V-shaped groove 232 is formed in the gate section 222 of the lead frame 220 near and parallel to a first edge 246 of the first surface 242 of the main DMOS chip 240. A second V-shaped groove 234 is formed in the source section 224 of the lead frame 220 near and parallel to a second edge 248 of the first surface 242 of the main DMOS chip 240. The first V-shaped groove 232 and the second V-shaped groove 234 are filled with the molding encapsulation 290.

The first plurality of metal bumps 260 are directly attached to the gate electrode 252 of the main DMOS chip 240 and directly attached to the gate section 222 of the lead frame 220. The second plurality of metal bumps 270 are directly attached to the source electrode 254 of the main DMOS chip 240 and directly attached to the source section 224 of the lead frame 220. The wire 280 connects the drain electrode 256 of the main DMOS chip 240 to the drain section 226 of the lead frame 220.

In examples of the present disclosure, the insulation material 230 is between a top surface of the lead frame 220 and the first surface 242 of the main DMOS chip 240. In examples of the present disclosure, the insulation material 230 is directly attached to the first surface 242 of the main DMOS chip 240, the first plurality of metal bumps 260, the second plurality of metal bumps 270, the gate section 222 of the lead frame 220 and the source section 224 of the lead frame 220. In one example, the insulation material 230 is an electromagnetic shielding material.

The insulation material 230, the main DMOS chip 240, the first plurality of metal bumps 260, the second plurality of metal bumps 270, the wire 280 and a majority portion of the lead frame 220 are embedded in the molding encapsulation 290. To achieve thermal performance and to reduce EMI noise, in one example, the bottom surface area of the source section 224 exposed outside the molding encapsulation 290 accounts for more than 50% of the bottom surface area of the DMOS package 200. In another example, the bottom surface area of the source section 224 exposed outside the molding encapsulation 290 accounts for more than 70% of the bottom surface area of the DMOS package 200. In still another example, the bottom surface area of the source section 224 exposed outside the molding encapsulation 290 is more than 10 times the bottom surface area of the drain section 226 exposed outside the molding encapsulation 290.

Figure 4B:
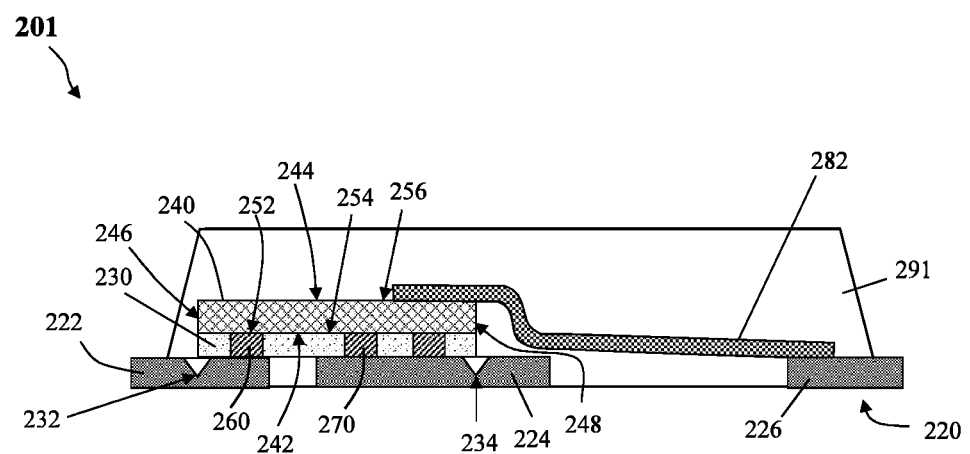
FIG. 4B is a cross sectional view of yet another DMOS package in examples of the present disclosure.

FIG. 4B is a cross sectional view of a DMOS package 201 in examples of the present disclosure. The DMOS package 201 includes a lead frame 220, an insulation material 230, a main DMOS chip 240, a first plurality of metal bumps 260, a second plurality of metal bumps 270, a clip 282 and a molding encapsulation 291. The lead frame 220 includes a gate section 222, a source section 224 and a drain section 226. The main DMOS chip 240 has a gate electrode 252 and a source electrode 254 disposed on a first surface 242 of the main DMOS chip 240 and a drain electrode 256 disposed on a second surface 244 of the main DMOS chip 240. The second surface 244 is opposite the first surface 242. The second surface 244 is parallel to the first surface 242. The second surface 244 is at a location higher than the first surface 242. To achieve thermal performance and to reduce EMI noise, in one example, the bottom surface area of the source section 224 exposed outside the molding encapsulation 291 accounts for more than 50% of the bottom surface area of package 201. In another example, the bottom surface area of the source section 224 exposed outside the molding encapsulation 291 accounts for more than 70% of the bottom surface area of package 201. In still another example, the bottom surface area of the source section 224 exposed outside the molding encapsulation 291 is more than 10 times the bottom surface area of the drain section 226 exposed outside the molding encapsulation 291.

Figure 5:
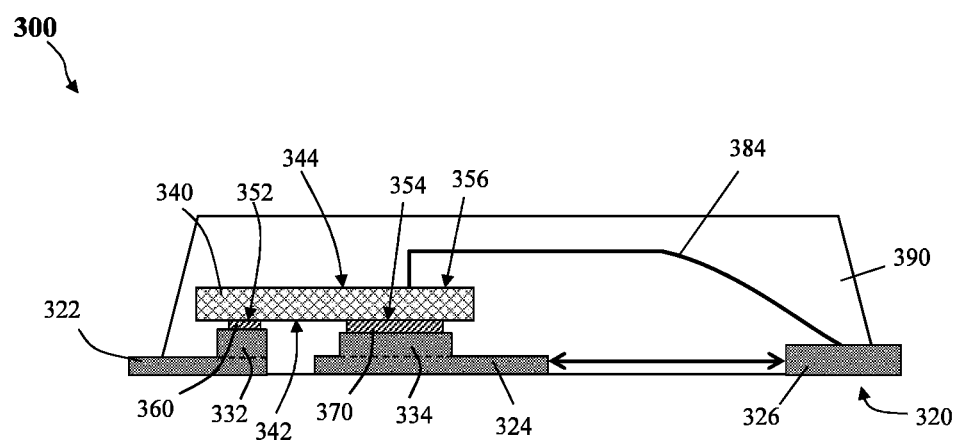
FIG. 5 is a cross sectional view of still another DMOS package in examples of the present disclosure.

FIG. 5 is a cross sectional view of a double-diffused metal-oxide semiconductor (DMOS) package 300 in examples of the present disclosure. The DMOS package 300 includes a lead frame 320, a main DMOS chip 340, a first plurality of metal bumps 360, a second plurality of metal bumps 370, a ribbon 384 and a molding encapsulation 390. The lead frame 320 includes a gate section 322, a source section 324 and a drain section 326. The main DMOS chip 340 has a gate electrode 352 and a source electrode 354 disposed on a first surface 342 of the main DMOS chip 340 and a drain electrode 356 disposed on a second surface 344 of the main DMOS chip 340. The second surface 344 is opposite the first surface 342. The second surface 344 is parallel to the first surface 342. The second surface 344 is at a location higher than the first surface 342.

The first plurality of metal bumps 360 are directly attached to the gate electrode 352 of the main DMOS chip 340 and directly attached to the gate section 322 of the lead frame 320. The second plurality of metal bumps 370 are directly attached to the source electrode 354 of the main DMOS chip 340 and directly attached to the source section 324 of the lead frame 320. The ribbon 384 connects the drain electrode 356 of the main DMOS chip 340 to the drain section 326 of the lead frame 320.

In examples of the present disclosure, the gate section 322 of the lead frame 320 has a first raised portion 332. The source section 324 of the lead frame 320 has a second raised portion 334. The first plurality of metal bumps 360 are directly attached to the first raised portion 332. The second plurality of metal bumps 370 are directly attached to the second raised portion 334.

The main DMOS chip 340, the first plurality of metal bumps 360, the second plurality of metal bumps 370, the ribbon 384 and a majority portion of the lead frame 320 are embedded in the molding encapsulation 390. To achieve thermal performance and to reduce EMI noise, in one example, the bottom surface area of the source section 324 exposed outside the molding encapsulation 390 accounts for more than 50% of the bottom surface area of the DMOS package 300. In another example, the bottom surface area of the source section 324 exposed outside the molding encapsulation 390 accounts for more than 70% of the bottom surface area of the DMOS package 300. In still another example, the bottom surface area of the source section 324 exposed outside the molding encapsulation 390 is more than 10 times the bottom surface area of the drain section 326 exposed outside the molding encapsulation 390.

Figure 6:
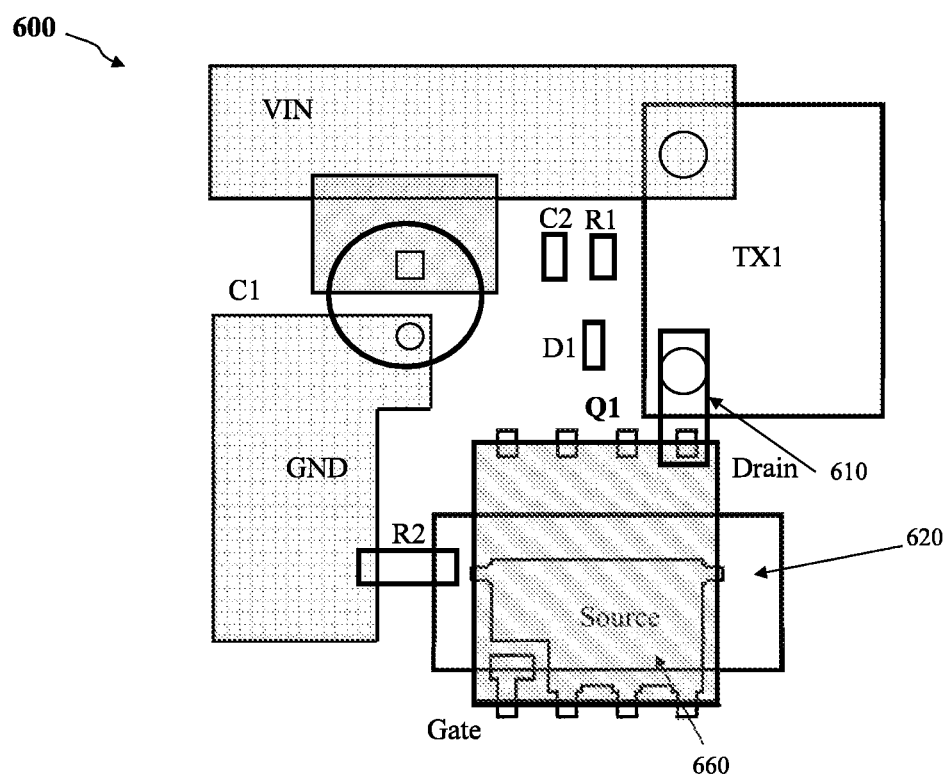
FIG. 6 shows a PCB layout for a single-switch flyback converter in examples of the present disclosure.

FIG. 6 shows another PCB layout 600 for a single-switch flyback converter in examples of the present disclosure. In examples of the present disclosure, The PCB layout 600 has a large copper pad area 620 connected to ground through resistor R2 and a small copper pad area 610 connected to a high voltage input through transformer TX. The PCB layout 600 is configured to receive a main DMOS switch Q1 having a construction as shown in FIG. 3, FIG. 4A, FIG. 4B or FIG. 5, with a source section attached to the large copper pad area 620 and the drain section attached a small copper pad area 610. The main DMOS chip is above the large copper pad area 620 with most of the bottom of source area 660 exposed outside the encapsulation of the DMOS package overlapping the large copper pad area 620. The source electrode of the main DMOS switch is connected to ground through resistor R2. The drain electrode of the main DMOS switch is connected to high input voltage through transformer TX1. In one example, the source area 660 is configured to connect to the source section 124 of the lead frame 120 of FIG. 3. In another example, the source area 660 is configured to connect to the source section 224 of the lead frame 220 of FIG. 4A. In still another example, the source area 660 is configured to connect to the source section 324 of the lead frame 320 of FIG. 5. It provides more safety space for high voltage. It has better reliability. A smaller drain area requires less space for insulation. Even with a large copper pad area 620 (for example, larger than 10 mm in length and 5 mm in width), the EMI noise is smaller than that of FIG. 4.

Figure 7:
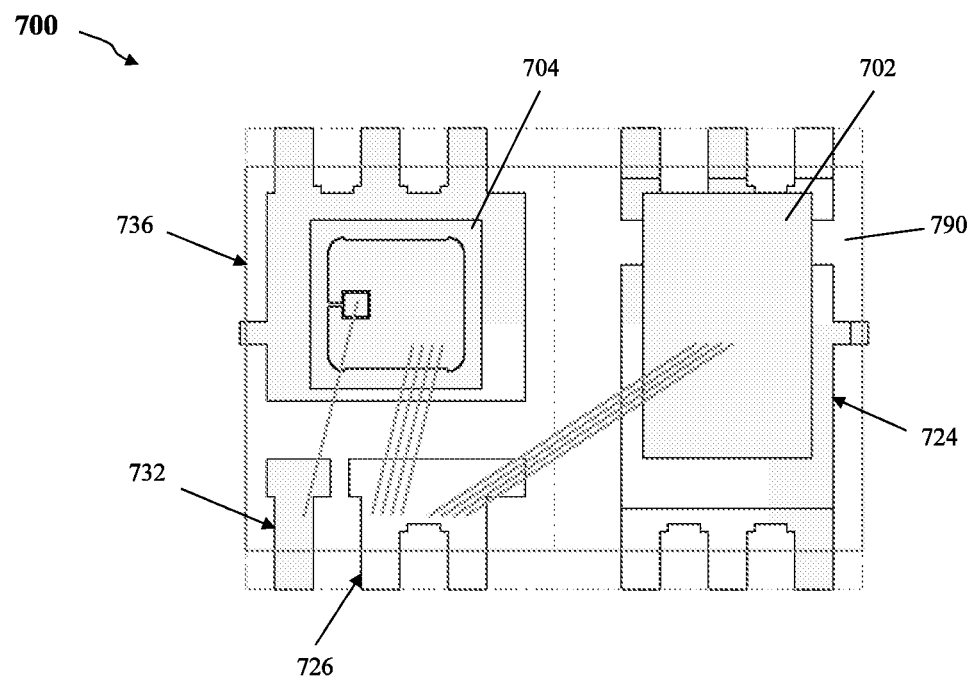
FIG. 7 is a top view of a pair-switch DMOS package having a main switch and a clamping switch in examples of the present disclosure.

FIG. 7 is a top view of a pair-switch DMOS package 700 having a main switch 702 and a clamping switch 704 in examples of the present disclosure. In one example, the main switch is a main DMOS chip same as the main DMOS chip 140, 240 or 340 in the single switch DMOS packages 100, 200, 201 or 300. The pair-switch DMOS package 700 is substantially the same package as 100, 200, 201 or 300 except that the lead frame of the pair-switch DMOS package 700 has in addition a clamping switch section 736 and an optional clamping switch gate section 732. The clamping switch is a clamping DMOS chip having its drain electrode directly attached to the clamping switch section 736, its gate electrode electrically connected to the clamping gate section 732 through a conductive member, and its source electrode electrically connected to the drain section 726 to which the drain electrode of the main switch 702 is also connected. Alternatively the source electrode of the clamping DMOS chip may be connected to the drain electrode of the main DMOS chip through one or more conductive members (not shown). The clamping DMOS chip has a chip size less than ⅛ of the chip size of the main DMOS chip. The main switch 702 and the clamping switch 704 are embedded in the molding encapsulation 790. To achieve thermal performance and to reduce EMI noise, in one example, the bottom surface area of the source section 724 exposed outside the molding encapsulation 790 accounts for more than 30% of the bottom surface area of the pair-switch DMOS package 700. In another example, the bottom surface area of the source section 724 exposed outside the molding encapsulation 790 accounts for more than 50% of the bottom surface area of the pair-switch DMOS package 700. In still another example, the bottom surface area of the source section 724 exposed outside the molding encapsulation 790 is more than 10 times the bottom surface area of the drain section 726 exposed outside the molding encapsulation 790.

In examples of the present disclosure, the clamping switch 704 is a clamping DMOS chip having a source electrode above a drain electrode. Therefore, a vertical distance between the source electrode of the chip of the clamping switch 704 and the lead frame (for example, the lead frame 120 of FIG. 3) is smaller than a vertical distance between the drain electrode of the chip of the clamping switch 704 and the lead frame (for example, the lead frame 120 of FIG. 3). As an option, the pair-switch DMOS package 700 may also include a driver circuit integrated with the clamping DMOS chip or as a separate chip copacked inside the packaged (not shown).

Figure 8:
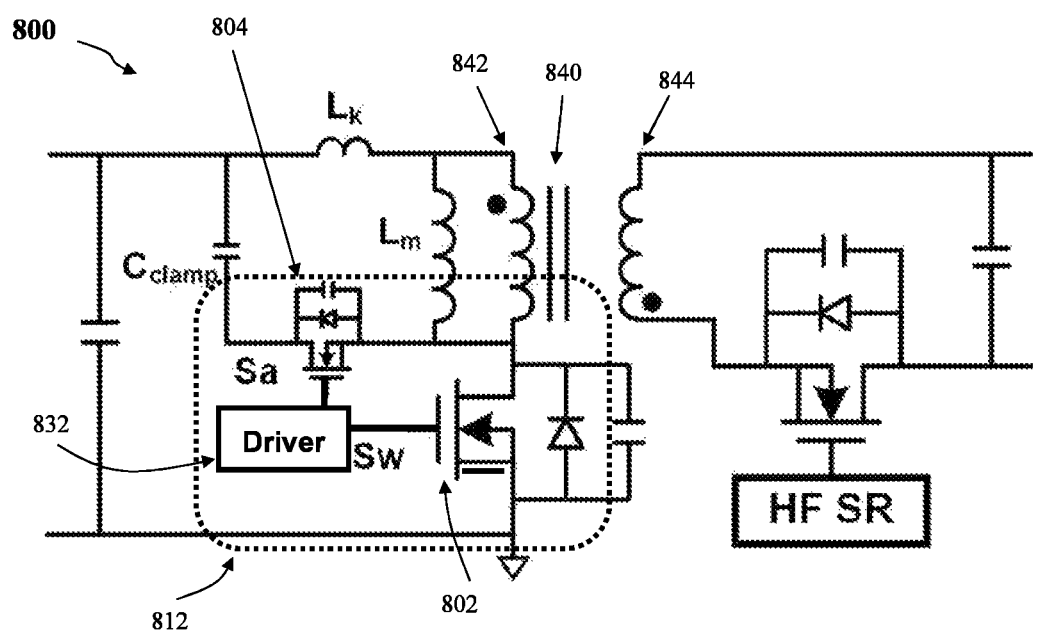
FIG. 8 shows application circuitry of a pair-switch flyback converter in examples of the present disclosure.

FIG. 8 shows application circuitry 800 of a pair-switch flyback converter in examples of the present disclosure. The pair-switch flyback converter includes a package 812 and a transformer 840. In examples of the present disclosure, the package 812 is the pair-switch DMOS package of FIG. 7. The package 812 further includes a driver 832. The transformer 840 has a primary winding 842 and a secondary winding 844. A first end of the main switch 802 is connected to a first end of the primary winding 842 of the transformer 840. A second end of the main switch 802 is connected to a ground. A control end of the main switch 802 is connected to the driver 832. The main switch 802 is for delivering energy to output. A clamping switch 804 is for delivering reactive power. The clamping switch 804 helps the main switch 802 to achieve zero-voltage switch (ZVS). The pair-switch flyback converter of FIG. 8 may be implemented on a PCB similar to the PCB layout 600 in FIG. 6 having a large copper pad area 620 for connecting the main switch source electrode and a small copper pad area 610 for connecting the main switch drain electrode.

Figure 9:
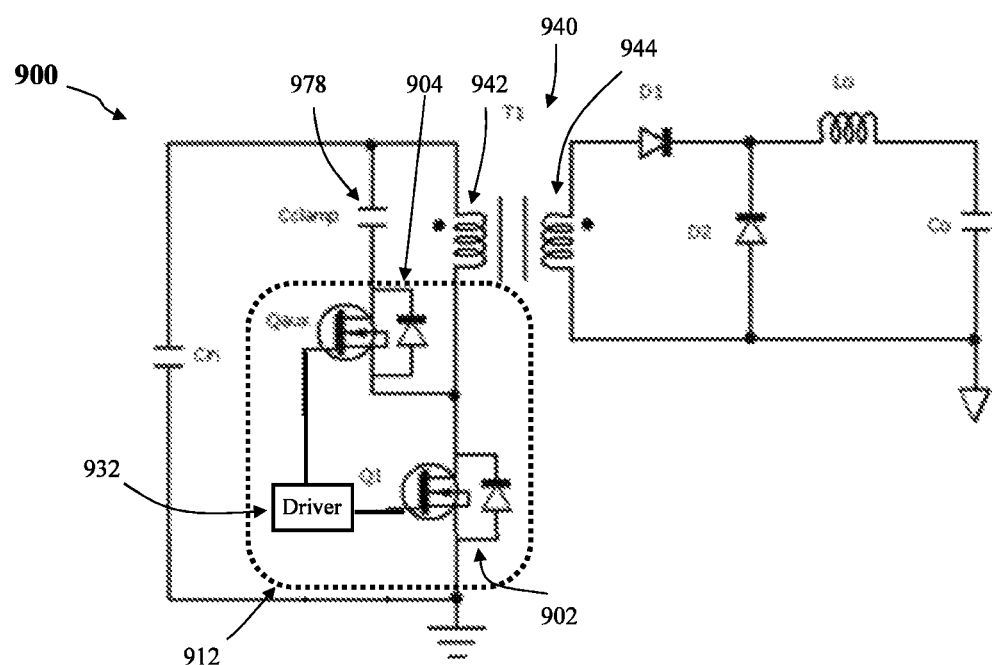
FIG. 9 shows application circuitry of a pair-switch active clamp forward converter in examples of the present disclosure.

FIG. 9 shows application circuitry 900 of a pair-switch active clamp forward converter in examples of the present disclosure. The pair-switch active clamp forward converter includes a package 912, the clamp capacitor 978, and a transformer 940. In examples of the present disclosure, the package 912 is the pair-switch DMOS package of FIG. 7. The package 912 further includes a driver 932. The transformer 940 has a primary winding 942 and a secondary winding 944. A first end of the main switch 902 is connected to a first end of the primary winding 942 of the transformer 940. A second end of the main switch 902 is connected to a ground. A control end of the main switch 902 is connected to the driver 932. A clamping clamp may be implemented using an N-channel DMOS. The clamp capacitor 978 is in parallel to the primary winding 942 of the transformer 940. The clamping switch 904 helps the main switch 902 to achieve zero-voltage switch (ZVS). The pair-switch active clamp forward converter of FIG. 9 may be implemented on a PCB similar to the PCB layout 600 in FIG. 6 having a large copper pad area 620 for connecting the main switch source electrode and a small copper pad area 610 for connecting the main switch drain electrode.

Figure 10:
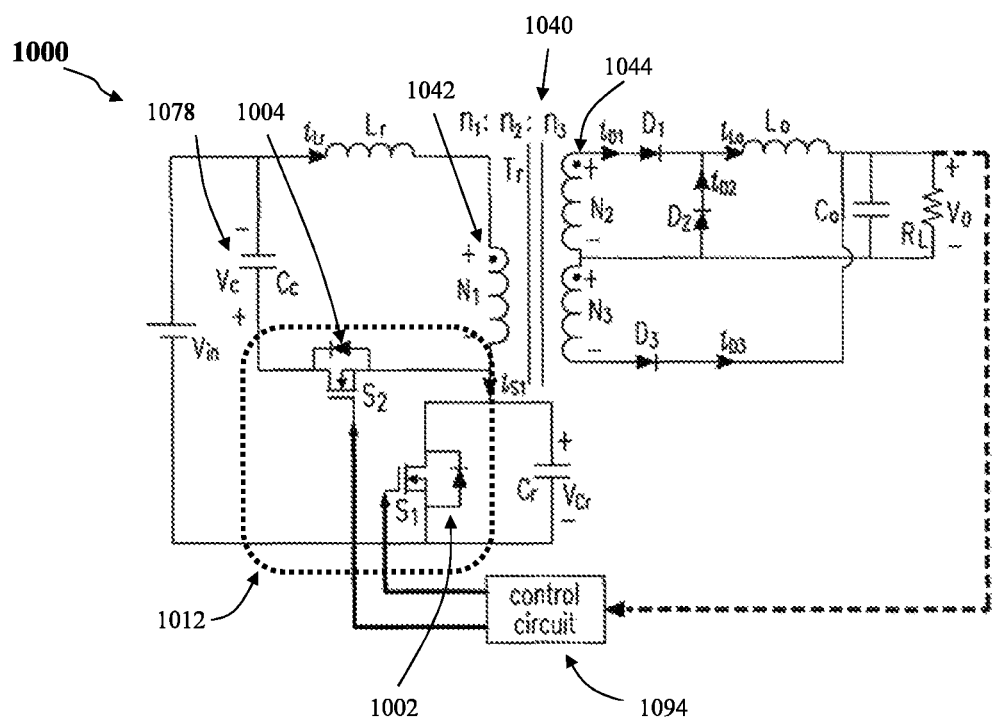
FIG. 10 shows application circuitry of a pair-switch active clamp forward/flyback converter in examples of the present disclosure.

FIG. 10 shows application circuitry 1000 of a pair-switch active clamp forward-flyback converter in examples of the present disclosure. The pair-switch active clamp forward-flyback converter includes a package 1012, a clamp capacitor 1078, a control circuit 1094 and a transformer 1040. In examples of the present disclosure, the package 1012 is the pair-switch DMOS package of FIG. 7. The package 1012 includes a main switch 1002 and a clamping switch 1004. The transformer 1040 has a primary winding 1042 and a secondary winding 1044. A first end of the main switch 1002 is connected to a first end of the primary winding 1042 of the transformer 1040. A control end of the main switch 1002 is connected to the control circuit 1094. The clamp capacitor 1078 is in parallel to the primary winding 1042 of the transformer 1040. A first end of the clamping switch 1004 is connected to a first end of the clamp capacitor 1078. The secondary winding 1044 is of a center-tapped configuration to integrate a forward sub-circuit and a flyback sub-circuit. The flyback sub-circuit under continuous conduction mode is employed to directly transfer the reset energy of the transformer 1040 to the output load. The forward sub-circuit under discontinuous conduction mode can correspondingly adjust the duty ratio with the output load change. Under the heavy load condition, the mechanism of active-clamp flyback sub-circuit can provide sufficient resonant current to facilitate the parasitic capacitance of the switches to be discharged to zero. Under the light load condition, the time interval in which the resonant current turns from negative into positive is prolonged to ensure zero voltage switching function. The pair-switch active clamp forward-flyback converter of FIG. 10 may be implemented on a PCB similar to the PCB layout 600 in FIG. 6 having a large copper pad area 620 for connecting the main switch source electrode and a small copper pad area 610 for connecting the main switch drain electrode.

Those of ordinary skill in the art may recognize that modifications of the embodiments disclosed herein are possible. For example, a number of metal bumps may vary. Other modifications may occur to those of ordinary skill in this art, and all such modifications are deemed to fall within the purview of the present invention, as defined by the claims.

The invention claimed is:

1. A power semiconductor package comprising:
a lead frame comprising
a source section; and
a drain section;
a first semiconductor chip including a metal-oxide-semiconductor field-effect transistor (MOSFET) disposed over the lead frame, the first semiconductor chip comprising
a source electrode disposed on a first surface of the first semiconductor chip, the source electrode being electrically connected to the source section of the lead frame, the first surface facing the lead frame; and
a drain electrode of the first semiconductor chip being electrically connected to the drain section of the lead frame; and
a molding encapsulation;
wherein the first semiconductor chip and a majority portion of the lead frame are embedded in the molding encapsulation;
wherein a bottom surface area of the source section exposed from the molding encapsulation is larger than a bottom surface area of the drain section exposed from the molding encapsulation so as to reduce an electromagnetic interference (EMI) noise for high voltage applications; and
wherein the bottom surface area of the source section exposed from the molding encapsulation is more than fifty percent of a bottom surface area of the power semiconductor package.

2. The power semiconductor package of claim 1, wherein a space between the source section and the drain section of the lead frame allows a voltage of 500V or higher.

3. The power semiconductor package of claim 1, wherein the drain electrode is disposed on a second surface of the first semiconductor chip; and wherein the second surface is opposite to the first surface.

4. The power semiconductor package of claim 1, wherein the first semiconductor chip further comprises a gate electrode disposed on the first surface of the first semiconductor chip.

5. The power semiconductor package of claim 4, wherein the lead frame further comprises a gate section; and wherein the gate electrode of the first semiconductor chip is electrically connected to the gate section of the lead frame.

6. The power semiconductor package of claim 1, wherein the bottom surface area of the source section exposed from the molding encapsulation is more than seventy percent of the bottom surface area of the power semiconductor package.

7. The power semiconductor package of claim 1, wherein the bottom surface area of the source section exposed from the molding encapsulation is more than ten times the bottom surface area of the drain section exposed from the molding encapsulation.

8. The power semiconductor package of claim 1 further comprising
a second semiconductor chip comprising a semiconductor transistor.

9. A power semiconductor package comprising:
a lead frame comprising
a source section; and
a drain section;
a first semiconductor chip including a metal-oxide-semiconductor field-effect transistor (MOSFET) disposed over the lead frame, the first semiconductor chip comprising
a source electrode disposed on a first surface of the first semiconductor chip, the source electrode being electrically connected to the source section of the lead frame, the first surface facing the lead frame; and
a drain electrode of the first semiconductor chip being electrically connected to the drain section of the lead frame;
a molding encapsulation; and
a second semiconductor chip comprising a semiconductor transistor;
wherein the first semiconductor chip and a majority portion of the lead frame are embedded in the molding encapsulation;
wherein a bottom surface area of the source section exposed from the molding encapsulation is larger than a bottom surface area of the drain section exposed from the molding encapsulation so as to reduce an electromagnetic interference (EMI) noise for high voltage applications; and
wherein a chip size of the second semiconductor chip is less than twenty percent of a chip size of the first semiconductor chip.

10. The power semiconductor package of claim 9, wherein the lead frame further comprises an additional switch section; and wherein the second semiconductor chip is disposed on the additional switch section.

11. The power semiconductor package of claim 10, wherein the bottom surface area of the source section exposed from the molding encapsulation is more than thirty percent of a bottom surface area of the power semiconductor package.

12. The power semiconductor package of claim 10, wherein the bottom surface area of the source section exposed from the molding encapsulation is more than ten times the bottom surface area of the drain section exposed from molding encapsulation.

13. The power semiconductor package of claim 10 further comprising a diver circuit.

14. A high voltage converter implemented on a printed circuit board (PCB), the high voltage converter comprising:
a transformer comprising a primary winding and a secondary winding;
a power semiconductor package comprising a first switch comprising
a source electrode connected to a source lead; and
a drain electrode connected to a drain lead;
wherein the drain lead is attached to a drain copper pad on the PCB such that the drain electrode of the first switch is electrically connected to a first terminal of the primary winding of the transformer;
wherein the source lead is attached to a source copper pad on the PCB; and
wherein an area the source lead contacting the source copper pad on the PCB is larger than an area the drain lead contacting the drain copper pad on the PCB.

15. The high voltage converter of claim 14,
wherein the PCB comprises a layout including a rectangular source copper pad area;
wherein a length of the rectangular source copper pad area is longer than ten millimeters; and
wherein a width of the rectangular source copper pad area is wider than five millimeters.

16. The high voltage converter of claim 14,
wherein the power semiconductor package has an exposed bottom area of the source lead at least ten times an exposed bottom area of the drain lead.

17. The high voltage converter of claim 14,
wherein the power semiconductor package has an exposed bottom area for the source lead at least fifty percent of a bottom surface area of the power semiconductor package.

18. The high voltage converter of claim 14,
wherein the power semiconductor package further comprises a second switch.

19. The high voltage converter of claim 18,
wherein the power semiconductor package further comprises a driver circuit.

20. A power semiconductor package comprising:
a lead frame comprising
a source section; and
a drain section;
a first semiconductor chip including a metal-oxide-semiconductor field-effect transistor (MOSFET) disposed over the lead frame, the first semiconductor chip comprising
a source electrode disposed on a first surface of the first semiconductor chip, the source electrode being electrically connected to the source section of the lead frame, the first surface facing the lead frame; and
a drain electrode of the first semiconductor chip being electrically connected to the drain section of the lead frame; and
a molding encapsulation;
wherein the first semiconductor chip and a majority portion of the lead frame are embedded in the molding encapsulation;
wherein a bottom surface area of the source section exposed from the molding encapsulation is larger than a bottom surface area of the drain section exposed from the molding encapsulation so as to reduce an electromagnetic interference (EMI) noise for high voltage applications; and
wherein the bottom surface area of the source section exposed from the molding encapsulation is more than ten times the bottom surface area of the drain section exposed from the molding encapsulation.

21. The power semiconductor package of claim 20, wherein the drain electrode is disposed on a second surface of the first semiconductor chip; and wherein the second surface is opposite to the first surface.

22. The power semiconductor package of claim 20, wherein the first semiconductor chip further comprises a gate electrode disposed on the first surface of the first semiconductor chip.

23. The power semiconductor package of claim 22, wherein the lead frame further comprises a gate section; and wherein the gate electrode of the first semiconductor chip is electrically connected to the gate section of the lead frame.

* * * * *